United States Patent
Johnson et al.

(10) Patent No.: US 6,924,235 B2
(45) Date of Patent: Aug. 2, 2005

(54) SIDEWALL SMOOTHING IN HIGH ASPECT RATIO/DEEP ETCHING USING A DISCRETE GAS SWITCHING METHOD

(75) Inventors: David Johnson, Palm Harbor, FL (US); Russell Westerman, Largo, FL (US); Shouliang Lai, Tampa, FL (US)

(73) Assignee: Unaxis USA Inc., St. Petersburg, FL (US)

( * ) Notice: Subject to any disclaimer, the term of this patent is extended or adjusted under 35 U.S.C. 154(b) by 0 days.

(21) Appl. No.: 10/640,469

(22) Filed: Aug. 12, 2003

(65) Prior Publication Data

US 2004/0092118 A1 May 13, 2004

Related U.S. Application Data

(60) Provisional application No. 60/403,891, filed on Aug. 16, 2002.

(51) Int. Cl.[7] .............................................. H01L 21/302
(52) U.S. Cl. ....................................... 438/689; 438/706
(58) Field of Search .................................. 438/689, 712

(56) References Cited

U.S. PATENT DOCUMENTS

| | | | |
|---|---|---|---|
| 4,563,367 A | * | 1/1986 | Sherman ..................... 427/563 |
| 4,579,623 A | | 4/1986 | Suzuki et al. |
| 4,916,089 A | | 4/1990 | Van Suchtelen et al. |
| 4,935,661 A | | 6/1990 | Heinecke et al. |
| 4,985,114 A | * | 1/1991 | Okudaira et al. ............. 216/37 |
| 5,451,260 A | | 9/1995 | Versteeg et al. |
| 5,501,893 A | * | 3/1996 | Laermer et al. ............. 428/161 |
| 6,051,503 A | | 4/2000 | Bhardwaj et al. |
| 6,261,962 B1 | * | 7/2001 | Bhardwaj et al. ........... 438/702 |
| 6,284,148 B1 | | 9/2001 | Laermer et al. |
| 6,303,512 B1 | * | 10/2001 | Laermer et al. ............. 438/712 |
| 6,360,685 B1 | * | 3/2002 | Xia et al. ............. 118/723 ME |
| 2002/0073924 A1 | | 6/2002 | Chiang et al. |
| 2002/0094689 A1 | | 7/2002 | Park |

FOREIGN PATENT DOCUMENTS

| | | |
|---|---|---|
| JP | 57161065 | 10/1982 |
| JP | 60182722 | 9/1985 |
| JP | 01146327 | 6/1989 |
| JP | 03023624 | 1/1991 |

OTHER PUBLICATIONS

Pulse–Time–Modulated Plasma Etching for High Performance Polysilicon Patterning on Thin Gate Oxides

* cited by examiner

*Primary Examiner*—Thao P. Le
(74) *Attorney, Agent, or Firm*—Holland & Knight LLP

(57) ABSTRACT

An improved method for introducing gases into an alternating plasma etching/deposition chamber is provided by the present invention. To minimize the introduction of pressure pulses into the alternating etching/deposition chamber when the deposition and etchant gas supplies are switched on and off, a mass flow controller is used to provide a relatively constant flow of gas. A gas bypass or a gas exhaust is provided such that when a gas inlet to the alternating etching/deposition chamber is closed an alternative path is provided for the flow of gas from the mass flow controller. The provision of a bypass or exhaust maintains the pressure of the gas received from the mass flow controller at a substantially constant level. The elimination or minimization of a pressure pulse of the gas helps increase the smoothness of the walls of high aspect ratio features etched in a silicon substrate in the alternating etching/deposition chamber.

17 Claims, 4 Drawing Sheets

Schematic drawings for the principle of fast discrete gas switching in etch processes. (A.) Gas A is fed to the process chamber while gas B is bypassed to exhaust.
(B.) Gas B is fed to the process chamber while gas A is bypassed to exhaust.

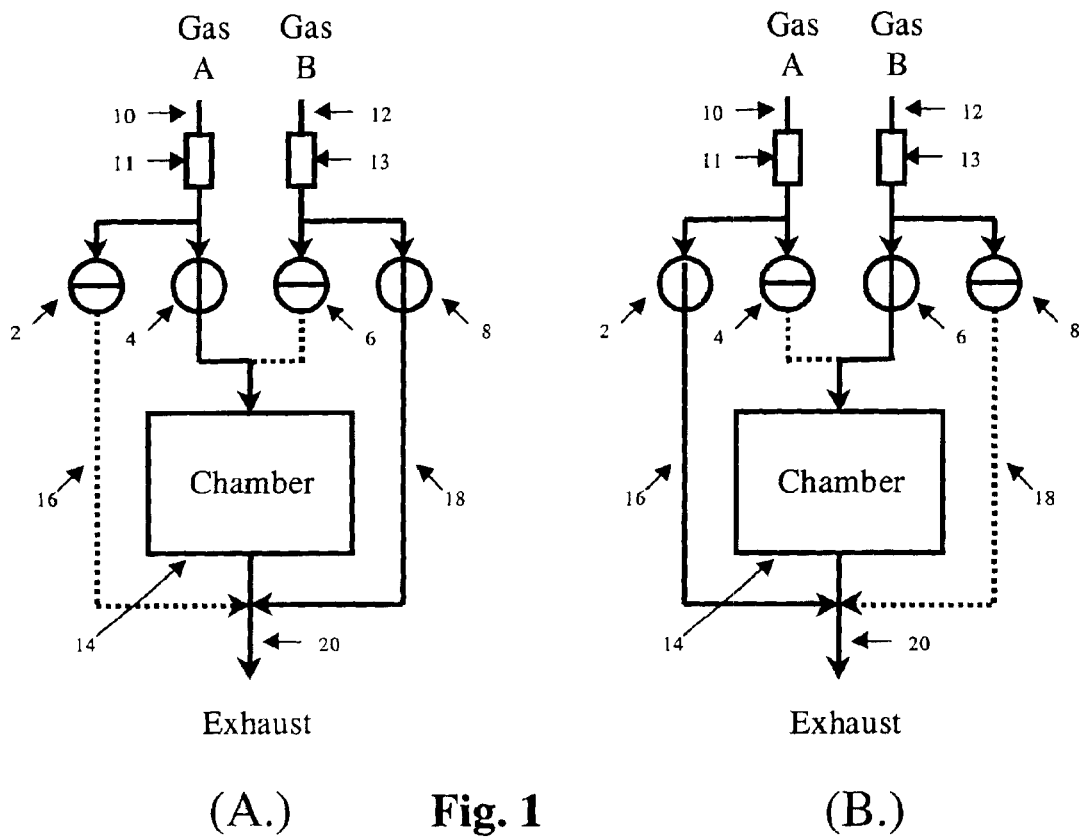
*Figure 1.* Schematic drawings for the principle of fast discrete gas switching in etch processes. (A.) Gas A is fed to the process chamber while gas B is bypassed to exhaust. (B.) Gas B is fed to the process chamber while gas A is bypassed to exhaust.

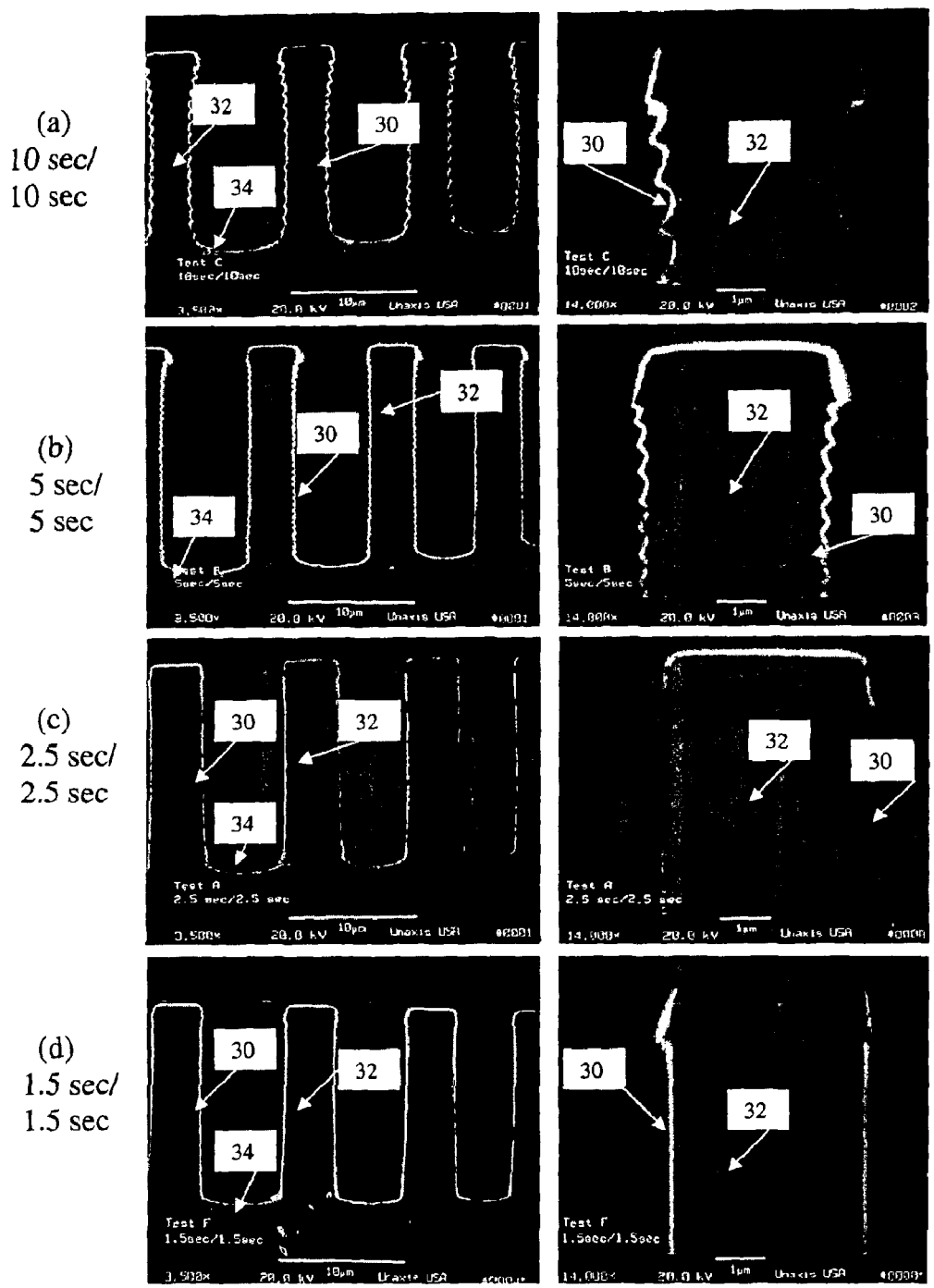
Figure 2 SEM images showing scallop amplitude is progressively reduced as the gas cycle time used in the silicon etching processes is reduced. Times in the figure are listed as *etch time / deposition time*. (*i.e. 1.5 second / 1.5 second represents a TDM process using 1.5 second etch steps alternately cycled with 1.5 second deposition segments*).

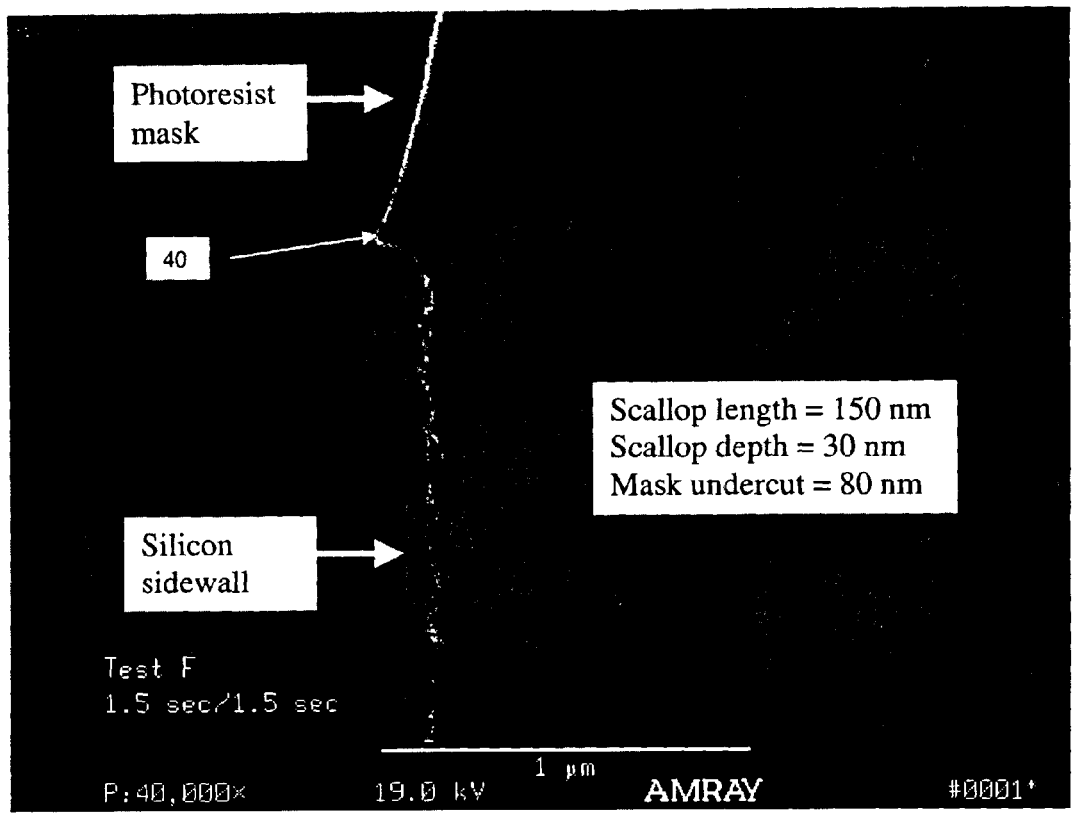
*Figure 3.* A high-resolution SEM image showing minimized scalloping (High magnification SEM cross section of sample shown in Figure 2(d) – 1.5 second etch segments in conjunction with 1.5 second deposition segments).

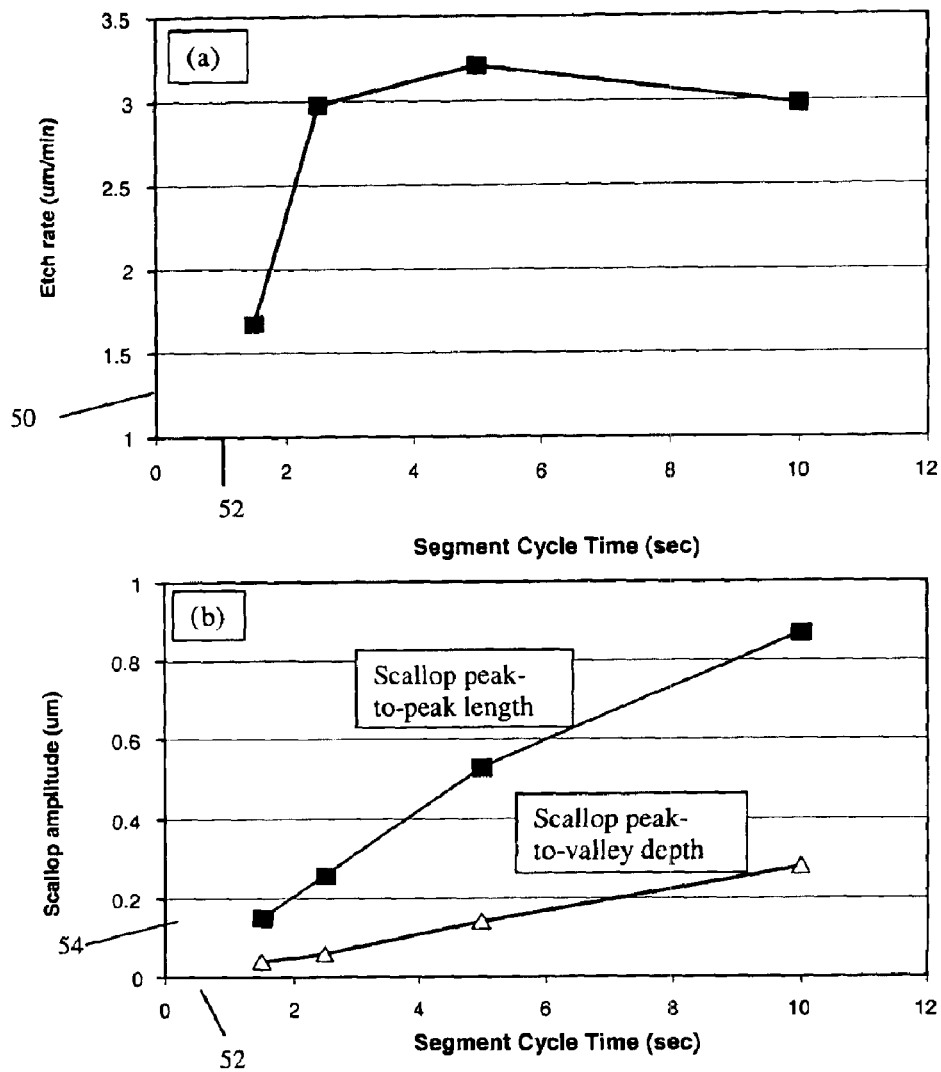
*Figure 4* (a) Dependence of overall silicon etch rate on gas cycle time. The etch rate remains nearly constant until the gas cycle time approaches the process chamber residence time (~1.5 second chamber residence time for these experiments). (b) Dependence of scallop amplitudes on gas cycle time.

SIDEWALL SMOOTHING IN HIGH ASPECT RATIO/DEEP ETCHING USING A DISCRETE GAS SWITCHING METHOD

CROSS REFERENCES TO RELATED APPLICATIONS

This application claims priority from and is related to commonly owned U.S. Provisional Patent Application Ser. No. 60/403,891, filed Aug. 16, 2002, entitled: Sidewall Smoothing in High Aspect Ratio/Deep Etching Using a Discrete Gas Switching Method, this Provisional Patent Application incorporated by reference herein.

FIELD OF THE INVENTION

The present invention is generally related to the field of semiconductor manufacturing. More particularly, preferred embodiments of the present invention are directed toward means for improving time division multiplexed deposition/etching processes by using an adjustable fast discrete gas switch for alternately introducing process gases into the deposition/etching chamber and bypassing the chamber.

BACKGROUND

The fabrication of high aspect ratio features in silicon is used extensively in the manufacture of micro-electro-mechanical-systems (MEMS) devices. Such features frequently have depths ranging from tens to hundreds of micrometers. To ensure manufacturability, the etching processes must operate at high etch rates to maintain reasonable throughputs. To ensure proper device performance, sidewall smoothness is often a critical requirement.

Conventional, single step, plasma etch processes cannot simultaneously meet these needs. As a result, a time division multiplex process has been developed where a deposition process is continuously alternated with an etch process. Each etch-deposition process pair constitutes a process cycle. The time division multiplexed (TDM) approach to etching silicon has been described by Laermer et. al. (U.S. Pat. No. 5,501,893, also known as the "Bosch" process). The TDM etch process is typically carried out in a reactor configured with a high-density plasma source, typically an Inductively Coupled Plasma (ICP) source, in conjunction with a radio frequency (RF) biased substrate electrode. The most common process gases used in the TDM etch process for silicon are sulfur hexafluoride and octofluorocyclobutane. Sulfur hexafluoride ($SF_6$) is typically used as the etch gas and octofluorocyclobutane ($C_4F_8$) as the deposition gas. During the etch step, $SF_6$ facilitates spontaneous and isotropic etching of silicon (Si); in the deposition step, $C_4F_8$ facilitates the deposition of the protective polymer layer onto the sidewalls as well as the bottom of the etched structures. The TDM alternating etch/deposition or "Bosch" process cyclically alternates between etch and deposition process steps enabling high aspect ratio structures to be defined into a masked silicon substrate. Upon energetic and directional ion bombardment, which is present in the etch steps, the polymer film coated in the bottom of etched structures from the previous deposition step will be removed to expose the silicon surface for further etching. The polymer film on the sidewall will remain because it is not subjected to direct ion bombardment, thereby, inhibiting lateral etching. While the TDM process consists of multiple etch-deposition cycles, either the etch or deposition (or both) portion of the cycle can be further divided into multi-step segments. Using the TDM approach allows high aspect ratio features to be defined into silicon substrates at high Si etch rates.

During the course of a conventional TDM etch process, it is known that process adjustments (known in the art as process morphing) are required to maintain vertical feature profiles, particularly for higher aspect ratios. Bhardwaj et. al. (U.S. Pat. No. 6,051,503) and Laermer et. al. (U.S. Pat. No. 6,284,148) teach increasing the deposition rate and/or decreasing the etch rate at the beginning of the process as solutions to this problem. Bhardwaj teaches that this deposition/etch rate adjustment can be accomplished by varying the process gas flows from cycle to cycle within the TDM process.

In a conventional TDM etch apparatus, gas introduction to the process chamber is controlled through a combination of mass flow controllers (MFCs) and isolation valves. During the etch segments, $SF_6$ "on", ($SF_6$ is supplied to the process chamber) it is often beneficial (but not essential) to exclude the deposition gas ($C_4F_8$) from the process chamber. Similarly, during the deposition step, $C_4F_8$ "on", ($C_4F_8$ is supplied to the process chamber) it is often beneficial (but not essential) to exclude the etch gas ($SF_6$) from the process chamber.

It is known that turning an MFC on at the beginning of a process step results in a short pressure "burst" into the chamber until the MFC stabilizes to the setpoint value. For processes with longer step times, the effect of the pressure "burst" on the process is insignificant. However, as the process step times decrease, the pressure "burst" causes the process pressure to be out of compliance for a significant portion of the segment process time. For a TDM etch process, where the segment times are on the order of 5 seconds per segment, these repetitive pressure bursts adversely affect process reproducibility and stability. It is also known that holding the MFC at some low setpoint (near 1 sccm) in the "off" state, instead of a zero flow, improves stability. There is still a need, however, for a gas control system that facilitates stable system operation in processes that require fast repetitive gas composition changes.

One limitation of the TDM approach to etching is roughened feature side walls. This limitation is due to the periodic etch/deposition scheme used in a TDM etch process and is known in the art as side wall "scalloping". For many MEMS device applications, it is desirable to minimize this side wall roughness or scalloping. The extent of scalloping in a TDM etch process is typically measured as a scallop length and depth. The scallop length is the peak-to-peak distance of the side wall roughness and is directly correlated to the etch depth achieved during a single etch cycle. The scallop depth is the peak to valley distance of side wall roughness and is correlated to the degree of anisotropy of an individual etch step. The extent of scallop formation can be minimized by shortening the duration of each etch/deposition cycle (shorter etch/deposition cycles repeated at a higher frequency), or by making each etch step more anisotropic in nature (e.g. allowing both the etchant and a small amount of the passivant to be present together in the etch step.)

In addition to smoother feature sidewalls it is also desirable to achieve higher overall TDM etch rates. The overall etch rate of a TDM etch process can be increased by either increasing the time spent in each etch cycle or increasing the efficiency within an etch cycle. Both of these approaches lead to larger scallop formation and ultimately rougher side walls. In a conventional TDM etch process, faster etch rates are only achievable at the expense of rougher side walls. Accordingly, there is a need for a high rate TDM etch process with smoother feature walls.

In a 1999 publication, Ayon et al. stated, without providing supporting information, "In general higher power to pressure ratios and shorter etching cycles tend to reduce this (scallop) effect." It is well understood that at a given plasma power level, a lower pressure of $SF_6$ results in a lower etch rate; and a lower pressure of $C_4F_8$ results in more polymer deposition which in turn leads to a lower etch rate. Though Ayon suggests shorter cycle times, the reported results only investigate the process space with deposition cycle times of 6 seconds or more and etch cycle times of 10 seconds or more without disclosing a method for controlling process gases on faster time scales.

In conventional TDM etch reactors, even when gas MFCs are held at a low setpoint during the "off" state, the response time of an individual MFC limits practical process segment times to greater than 2 seconds. Accordingly, there is a need for faster gas switching in TDM etching to achieve shorter process segment times.

A number of groups have reported deep silicon etch results using the TDM etch approach. The processes reported by these groups all used deposition cycle times of 4 seconds or longer while the reported etch times were 10 seconds or longer. Blauw et. al. report shorter cycle times with the TDM process through the use of fast mass flow controllers. Blauw reports a process using a 2 second deposition cycle in conjunction with a 5 second etch cycle. Blauw does not disclose a method for gas switching that allows the mass flow controllers to maintain a nearly constant flow of the etch and deposition gases during both the deposition and etch segments of the TDM process.

It is also known to minimize scalloping amplitude in a deep silicon etch by replacing the isotropic etching steps with anisotropic etching steps. For example, the addition of oxygen ($O_2$) or nitrogen ($N_2$) to the $SF_6$ gas in the etch segments would slow down the etch rate at the sidewall (lateral etch rate) during the etch cycles. The reduced lateral etching is due to the formation of silicon oxide or nitride on the silicon sidewall. While this approach reduces scalloping, it is at the expense of the overall feature profile. Note, the formed oxide or nitride passivation layer is typically only a few monolayers thick which results in a process that is more difficult to control. U.S. Pat. No. 6,303,512 (Laermer et. al) addresses this limitation through the use of a $SiF_4/O_2$ based alternate process chemistry. One of the drawbacks of this technique is that the addition of oxygen-scavenger gases (such as $CHF_3$, $C_4F_8$, $CF_4$ etc.) to the plasma is needed to minimize oxide formation on the etch front—the bottom—to obtain the desired overall etch rate. The U.S. Pat. No. 6,303,512 patent does not disclose TDM cycle times faster than 5 seconds per segment or the use of a process gas bypass line to facilitate process segment cycle times shorter than 5 seconds.

Gas switching was disclosed in a time division multiplex etch patent (U.S. Pat. No. 5,501,893, Laermer et. al.). The U.S. Pat. No. 5,501,893 patent teaches gas switching at time scales near 1 minute per process segment, but does not teach the use of a gas bypass line to exhaust in conjunction with a shut-off valve as a means to quickly switch the process gases between the etch and deposition steps.

Suzuki et al. also disclose a gas switching method for TDM processes (U.S. Pat. No. 4,579,623). Suzuki teaches gas pulsing through the use of shut off valves in conjunction with a needle valve to maintain a constant gas flow. The shut off valves allow the gas to be either introduced to the process chamber or discharged to avoid pressure build up between the needle valve and the chamber shut off valve. As a consequence of using a needle valve in conjunction with gas switching, Suzuki's disclosure is limited to constant gas flow processes, which does not permit "morphing". Suzuki does not teach gas switching that can be used for a TDM process where the gas flows are changed either within a cycle or cycle to cycle.

Suzuki also teaches discharging the gas between the needle valve and the shut off valve during the periods where the gas is not introduced into the vacuum chamber (the "off" cycle when gas is not introduced into the process). This discharge prevents pressure buildup between the needle valve and the shut off valve. Suzuki does not teach discharging the gas into the same chamber downstream of the reaction zone during the "off" cycle in order to present a more uniform gas load to the pumping system as the process gases cycle over time.

Furthermore, while Suzuki considers gas switching for plasma surface treatment processes that are cyclical and repeating, Suzuki does not teach gas switching for a TDM process that consists of alternating etching and polymerization steps.

Gas pulsing through the use of shut off valves in conjunction with mass flow controllers (MFCs) has been disclosed by Heinecke et. al. (U.S. Pat. No. 4,935,661). The Heinecke group teaches the use of a shut off valve after the process gas MFC in order to pulse process gases. Heinecke does not provide a bypass path for a process gas during the "off" state. Heinecke teaches leaving the MFC "on" while the shut off valve is in the "off" position and allowing the pressure to build in the line between the MFC and the valve. In this manner, when the valve is opened for the next process cycle using that gas, a pressure "burst" of that gas is released to the process chamber. Heinecke does not teach the use of a bypass path such that when the process gas is in the "off" state (not being introduced to the process chamber), the MFC remains "on" without a pressure buildup in the line. In addition, Heinecke does not teach the use of gas pulsing for cyclical etch/deposition processes.

Bhardwaj et. al. (U.S. Pat. No. 6,051,503) teaches gas switching for TDM etch processes where the gas flows are changed within a cycle or cycle to cycle. Bhardwaj does not teach the use of a gas bypass line to exhaust in conjunction with a shut-off valve as a means to quickly switch the process gases between the etch and deposition steps.

Van Suchtelen et. al (U.S. Pat. No. 4,916,089) teaches gas pulsing for epitaxial deposition. While Van Suchtelen teaches gas switching using a mass flow controller in conjunction with a gas bypass line, they do not teach the use of gas pulsing for etch processes, plasma-based processes, or cyclical etch/deposition processes.

SUMMARY OF THE INVENTION

A preferred embodiment of the present invention is directed toward an apparatus for providing gas to a chamber utilized for deposition and etching processes. The apparatus includes an etchant gas supply having an associated gas inlet for providing an etchant gas to the chamber and an associated gas outlet within the same vacuum system downstream of the reaction zone for exhausting the etchant gas. A deposition gas supply having an associated gas inlet provides a deposition gas to the chamber and an associated gas outlet exhausts the deposition gas within the same vacuum system downstream of the reaction zone. A gas control switch controls the etchant gas supply and the deposition gas supply such that the gas inlet and the gas exhaust are configured such that gas flows out of the gas exhaust when the gas inlet is closed. The gas control switch controls the flow of etchant gas and deposition gas from their associated gas inlets into the chamber such that a pressure pulse does not occur when the flow of gas into the chamber is initiated. Thus, the flow of gas from the associated gas inlet into the chamber is such that the gas is introduced into the chamber at a substantially constant pressure. In an especially preferred embodiment, the gas exhausts introduce gas flowing out of the gas exhausts into a chamber gas exhaust.

Another embodiment of the present invention is directed toward a gas supply system for providing gas to a deposition/etching chamber used to manufacture semiconductors. The gas supply system includes a mass flow controller for providing a flow of gas. A gas inlet introduces gas from the mass flow controller into the deposition/etching chamber. A gas bypass receives gas from the mass flow controller when the gas inlet is closed. The gas may be either an etchant gas or a deposition gas. A discrete gas switch controls the flow of gas from the mass flow controller such that the flow of gas from the mass flow controller is alternatively pulsed between the gas inlet and the gas bypass.

Yet another embodiment of the present invention is directed toward a method of controlling a flow of gas from a mass flow controller to a semiconductor manufacturing chamber to maximize a smoothness of sidewalls of etched trenches in a silicon substrate. In accordance with the method, a substantially constant flow of gas is provided from the mass flow controller. The flow of gas from the mass flow controller is provided to the chamber during a gas on state. The flow of gas from the mass flow controller to the chamber is diverted during a gas off state such that a pressure of the gas supplied from the mass flow controller remains relatively constant.

Yet another embodiment of the present invention is directed toward a method of anisotropic plasma etching of silicon in a chamber to provide laterally defined recess structures therein with smooth sidewalls. In accordance with the method, pulses of a reactive etchant gas are provided to the chamber for etching silicon alternated by pulses of a reactive polymerizing gas for depositing a polymer layer. The reactive etchant gas and the reactive polymerizing gas are delivered at a substantially constant rate from a mass flow controller. A surface of the silicon is plasma etched in an etching step by contact with the reactive etching gas to remove material from the surface of the silicon and provide exposed surfaces. At least one polymer is polymerized in a polymerizing step onto the surface of the silicon by contact with the reactive polymerizing gas during which the surfaces that were exposed in the preceding etching step are covered by a polymer layer thereby forming a temporary etching stop. The etching step and the polymerizing step are alternatingly repeated. Preferably, the reactive etchant gas and polymerizing gas are maintained at a substantially constant pressure during both an on-gas pulse state and an off-gas pulse state. This is accomplished by providing a gas bypass that allows the reactive gases to bypass the reactive zone in the chamber when they are pulsed off.

The above described embodiments of the present invention offer a number of improvements over the prior art. By minimizing changes in the pressure of the etchant and deposition gases introduced into the process chamber, embodiments of the present invention reduce the formation of scalloping on the sides of features etched into a silicon substrate. In addition, the reduction of introduced pressure pulses allows the process cycle time of an alternating etching/deposition process to be decreased substantially. Reducing the process time, increases the productivity of the process and thereby decreases the cost of the final product.

Thus, the present invention is a substantial improvement upon the prior art.

BRIEF DESCRIPTION OF THE DRAWINGS

FIGS. 1(*a–b*) are graphic representations of the operation of a gas bypass path in accordance with a preferred embodiment of the present invention;

FIGS. 2(*a–d*) are pictorial representations of scallop amplitude and its progressive reduction as the gas cycle time used in the silicon etching processes is reduced;

FIG. 3 is a high-resolution pictorial representation of the reduced scalloping shown in FIG. 2(*d*) that was achieved with a preferred embodiment of the present invention; and FIGS. 4(*a–b*) are graphical representations of the dependence of overall silicon etch rate on gas cycle time and the dependence of scallop amplitudes on gas cycle time respectively.

DETAILED DESCRIPTION OF THE INVENTION

A preferred embodiment of the present invention is directed towards a means of improving a time division multiplexed etch process by using an adjustable fast discrete gas switch for the introduction of process gases. This configuration improves sidewall smoothness, through reduction of scalloping, while maintaining a high etch rate.

In order to rapidly change the process gas composition provided to the process chamber, it is necessary to avoid large changes in the MFC set point. In the new proposed gas delivery configuration of a preferred embodiment of the present invention, the MFC set point can be held at a nearly constant level between etch and deposition process steps while maintaining the freedom to change MFC levels within a process step, see FIG. 1. In the new configuration, the first gas (Gas A) 10 metered through MFC 11 is directed to the process chamber 14 by opening the Gas A (10) chamber inlet valve 4 and closing the Gas A (10) chamber bypass valve 2. During the process step where Gas A (10) is required and Gas B (12) is not required, Gas B (12) metered through MFC 13 is directed straight to exhaust 20 by opening the Gas B chamber bypass valve 8 and closing the Gas B chamber inlet valve 6, see FIG. 1(*a*). The chamber exhaust is any suitable low pressure sink outside of the reactive zone within the chamber. The reactive zone of the chamber is the chamber volume where the process gas will react with substrate.

The schematic in FIG. 1(*b*) shows an example of a process step where Gas B (12) is required in the process chamber 14 and Gas A (10) is not required. Using this gas delivery configuration, it is possible to switch from process Gas A (10) to process Gas B (12) in the chamber 14 by simultaneously opening the Gas A chamber bypass valve 2 and the Gas B chamber inlet valve 6 while simultaneously closing the Gas A chamber inlet valve 4 and the Gas B chamber bypass valve 8. As the process gas 10 or 12 always has a path to exhaust, either through the chamber 14 or through the bypasses 16 and 18, the MFC supplying the gases 10 and 12 can remain at specified process setpoint value without building a back pressure in the gas lines 10 and 12 during the process gas "off" (bypassed) state. It is important to note that while the example in FIG. 1 shows the chamber bypass gas flows 16 and 18 rejoining the chamber exhaust 20, that alternatively the chamber bypass gas flows 16 and 18 can be diverted to any suitable low pressure gas sink. For a TDM etch process, the gas duty cycle for each gas 10 and 12 can be in the range of 1–99% with the total cycle time ranging from a less than one second to tens of seconds.

In another embodiment of the current invention, the frequency of the gas switching can be changed during the course of the process. The frequency change can either be made at one or more discrete points in the process or continuously through out the TDM process. It is also important to note that the present invention is not limited to the two-gas case presented in FIG. 1. Using the present invention, it is possible to pulse any number of gases using the same bypass and exhaust principle.

In yet another embodiment, the current invention can be applied to processes that use multiple gases where at least one of the process gas flows are not pulsed during the process. The continuously flowed gas flow rate can be held constant throughout the process or varied, either discretely or continuously through out the process using a conventional MFC while at least one gas is pulsed using the present invention. The continuously flowed gas may be the same as one of pulsed gases.

It is known in the art to segment either the etch or the deposition (or both) portion(s) of the process cycle into multiple segments. One example would be to divide the etch portion of the cycle into two segments. The first segment of the etch cycle can be optimized to remove the protective polymer film on horizontal surfaces from the previous deposition portion (typically through the use of higher RF bias power), while the second segment of the etch cycle can be optimized for high Si removal rates (typically through higher etch process pressures, higher reactive gas flows, or higher plasma densities). Thus, the present invention is also advantageously used in time division multiplexed processes where the pulsed process gas MFC flow rates are changed either within a segment and/or between segments.

The current invention can also be used in conjunction with other time division multiplexed parameters. For example RF power, pressure or any other process parameter can be time division multiplexed, either in phase or out of phase, with the discrete gas switching. The other time multiplexed parameters are not confined to the gas switching frequency.

Using the present invention, process gas composition can be switched in less than one second through the use of the isolation valves. In the present invention, the process chamber residence time, not the valve response times, will determine the minimum segment time possible for TDM etching. The residence time of the chamber can be reduced by reducing the process pressure, increasing the process gas flow, or reducing the chamber volume. The residence time of the gas manifold can also be minimized by placing the isolation valves near the process chamber gas delivery port. Minimizing the manifold volume between the isolation valves and the process chamber minimizes the gas manifold residence time.

Another benefit of this invention is that the total gas flow is more stable as compared with conventional gas flow schemes in commercially available plasma etchers. No pressure buildup occurs behind the gas in the MFC, because it is always "ON". This eliminates pressure "bursts" during gas composition changes and results in better plasma controllability and stability.

The invention described herein can be implemented in either high-density plasma etching processes, such as ICP (Inductively Coupled Plasma), ECR (Electron Cyclotron Resonance), or low density systems such as reactive ion etch (RIE). The gas switch method is applicable to etch processes in which one or more gases need to be changed over time. It is also important to note that even though this method was demonstrated using deep Si etching, it can be implemented for etching other materials, such as dielectric materials and metals, where a process with sharp composition changes is needed over short time scales.

Referring now to FIGS. 2(a-d), in accordance with a preferred embodiment of the present invention, an etching recipe of 25 sccm $C_4F_8$, 80 sccm $SF_6$, 20 W RIE and 1200 W ICP was used to etch a silicon substrate. For this example, the MFC gas flows setpoint, process pressure, temperatures and RF powers were held constant throughout the process. The duty cycle was kept constant at 50%. Actual gas switching times were 10 second etch/10 second deposition in FIG. 2(a), 5 second etch/5 second deposition in FIG. 2(b), 2.5 second etch/2.5 second deposition in FIG. 2(c) and 1.5 second etch/1.5 second deposition in FIG. 2(d). Scalloping 30 on the sidewalls 32 of the high aspect ratio trenches 34 is evident when relatively long deposition/etch cycles were used, as shown in FIGS. 2(a) and 2(b), while scalloping 30 is greatly reduced when the fast gas switching of the present invention is used, as shown in FIGS. 2(c) and 2(d). A high-resolution magnified SEM image shown in FIG. 3 reveals that the biggest scallop 40 peak-to-peak length is below 150 nm and the peak-to-valley depth is about 30 nm for the 1.5 second etch/1.5 second deposition process shown in FIG. 2(d).

Significantly, the high etch rate 50 obtained in the processes is sustained until the gas switch time 52 approaches the gas residence time in the chamber as shown in FIG. 4. From 10 second etch/10 second deposition cycle times 56 to 2.5 second etch/2.5 second deposition cycle times 52, scallop amplitude 54 is reduced by more than a factor of three, but etch rate 50 remains nearly constant at 3 $\mu$m/minute. The process using 1.5 second etch/1.5 second deposition is an exception as etch rate 50 drops by 50%. A calculation of the process chamber has shown that the gas residence time for these experiments was about 1.5 seconds. When gas switch cycle times 52 approach this level, the effectiveness of both deposition and etching steps is likely compromised.

It is worthwhile to note that the 3 $\mu$m/minute etch rate 50 was achieved with low $C_4F_8$ and $SF_6$ flow rates. The silicon etch rate 50 is known to increase with higher gas flow rates independent of the gas switching frequency at a fixed duty cycle.

It will be understood that the specific embodiments of the invention shown and described herein are exemplary only. Numerous variations, changes, substitutions and equivalents will now occur to those skilled in the art without departing from the spirit and scope of the present invention. Accordingly, it is intended that all subject matter described herein and shown in the accompanying drawings be regarded as illustrative only and not in a limiting sense and that the scope of the invention be solely determined by the appended claims.

What is claimed:

1. An apparatus for improved gas switching, said apparatus comprising:
    a plasma chamber;
    at least one plasma source for producing a plasma within said plasma chamber;
    a substrate holder positioned within said plasma chamber;
    an exhaust in fluid communication with said plasma chamber;
    an etchant gas supply having an associated gas inlet for providing an etchant gas to said plasma chamber and an associated gas bypass in fluid communication with said etchant gas supply and said exhaust of said plasma chamber for exhausting said etchant gas;

a deposition gas supply having an associated gas inlet for providing a deposition gas to said plasma chamber and an associated gas bypass in fluid communication with said deposition gas supply and said exhaust of said plasma chamber for exhausting said deposition gas; and a gas control switch, said gas control switch controlling at least one of said etchant gas supply and said deposition gas supply such that said gas inlet and said gas bypass of said at least one gas supply are configured such that the respective gas flows bypass said plasma chamber directly to said exhaust of said plasma chamber when the respective gas inlet is closed.

2. A gas supply system for providing gas to an alternating deposition/etching chamber used to manufacture semiconductors, said gas supply system comprising:

a mass flow controller for providing a flow of gas;

an exhaust in fluid communication with said deposition/etching chamber;

a gas inlet in fluid communication with said mass flow controller, said gas inlet allowing the flow of gas into said deposition/etching chamber; and a gas bypass in fluid communication with said mass flow controller and said exhaust, said gas bypass allowing the flow of gas directly from said mass flow controller to said exhaust when said gas inlet is closed.

3. The gas supply system of claim 2 wherein the gas further comprises an etchant gas.

4. The gas supply system of claim 2 wherein the gas further comprises a deposition gas.

5. The gas supply of claim 2 further comprising a discrete gas switch, said gas switch controlling the flow of gas from the mass flow controller such that the flow of gas from the mass flow controller is alternatively switched between the gas inlet and the gas bypass.

6. A method of controlling a flow of gas from a mass flow controller to a semiconductor manufacturing chamber to maximize a smoothness of sidewalls of etched trenches in a silicon substrate, said method comprising:

providing a specified flow of gas from the mass flow controller;

providing the flow of gas from the mass flow controller directly to the semiconductor manufacturing chamber during a gas on state; and diverting the flow of gas from the mass flow controller directly to an exhaust of the semiconductor manufacturing chamber through a gas bypass during a gas off state.

7. The method of claim 6 wherein the flow of gas is diverted from the chamber during the gas off state such that the pressure of the gas at the outlet of the mass flow controller remains relatively constant.

8. A method of anisotropic plasma etching of silicon in a chamber to provide laterally defined recess structures therein with smooth sidewalls, the method comprising:

providing directly to said chamber during a first gas on state pulses of a reactive etchant gas for etching silicon alternated by providing directly to said chamber during a second gas on state pulses of a reactive polymerizing gas for depositing a polymer layer;

diverting said reactive etchant gas directly to an exhaust in fluid communication with said chamber through a reactive gas bypass during a first gas off state and diverting said reactive polymerizing gas directly to said exhaust of said chamber through a polymerizing gas bypass during a second gas off state;

plasma etching in at least one etching step a surface of the silicon by contact with said reactive etching gas during said first gas on state to remove material from the surface of the silicon and provide exposed surfaces;

polymerizing in at least one polymerizing step at least one polymer onto the surface of the silicon by contact with said reactive polymerizing gas during said second gas on state which the surfaces that were exposed in said preceding etching step are covered by a polymer layer thereby forming a temporary etching stop; and alternatingly repeating the etching step and the polymerizing step.

9. The method of claim 8 wherein the pulses of reactive etchant gas are discretely pulsed within the etching step.

10. The method of claim 8 wherein the pulses of reactive polymerizing gas are discretely pulsed within the deposition step.

11. The method of claim 8 further comprising maintaining said reactive etchant gas at a substantially constant pressure at an outlet of a reactive etchant MFC during said first gas on state and said first gas off state.

12. The method of claim 8 further comprising maintaining said reactive polymerizing gas at a substantially constant pressure at an outlet of a reactive polymerizing MFC during said second gas on state and said second gas off state.

13. The method of claim 8 wherein the anisotropic plasma etching of silicon in the chamber further comprises the varying of one or more of the following parameters: gas flow rates, chamber pressure, plasma power, substrate bias, etch rate, deposition rate, cycle time, and etching/deposition ratio over time.

14. The method of claim 13 wherein the varying of one or more of the parameters is from process cycle to process cycle.

15. The method of claim 13 wherein the varying of one or more of the parameters is within the process cycle.

16. The method of claim 8 further comprising the step of delivering the reactive etchant gas at a substantially constant rate from a mass flow controller.

17. The method of claim 8 further comprising the step of delivering the reactive polymerizing gas at a substantially constant rate from a mass flow controller.

* * * * *